United States Patent
Kloeppel et al.

(10) Patent No.: US 9,910,211 B2
(45) Date of Patent: Mar. 6, 2018

(54) LIGHT GUIDE AND KEYBOARD BACKLIGHT

(71) Applicant: Lumitex, Inc., Strongville, OH (US)

(72) Inventors: Gregg M Kloeppel, Sheffield, OH (US); David Larson, Huntington Beach, CA (US); Peter Broer, Bratenahl, OH (US)

(73) Assignee: LUMITEX, INC., Strongsville, OH (US)

(*) Notice: Subject to any disclaimer, the term of this patent is extended or adjusted under 35 U.S.C. 154(b) by 181 days.

(21) Appl. No.: 13/801,729

(22) Filed: Mar. 13, 2013

(65) Prior Publication Data

US 2013/0242601 A1    Sep. 19, 2013

Related U.S. Application Data

(60) Provisional application No. 61/610,456, filed on Mar. 13, 2012.

(51) Int. Cl.
*F21V 8/00* (2006.01)
*G06F 3/02* (2006.01)
*H01H 13/83* (2006.01)

(52) U.S. Cl.
CPC ......... *G02B 6/0055* (2013.01); *G02B 6/0036* (2013.01); *G06F 3/0202* (2013.01); *G02B 6/006* (2013.01); *G02B 6/0068* (2013.01); *H01H 13/83* (2013.01); *H03K 2217/96046* (2013.01)

(58) Field of Classification Search
CPC .... G02B 6/0055; G02B 6/0036; G02B 6/006; G02B 6/0068; G06F 3/0202; H01H 13/83
USPC ............ 362/23.03, 602, 615, 606, 619, 625; 200/310
See application file for complete search history.

(56) References Cited

U.S. PATENT DOCUMENTS

| | | | | |
|---|---|---|---|---|
| 5,128,842 A | * | 7/1992 | Kenmochi | ........................ 362/95 |
| 6,447,136 B1 | * | 9/2002 | Liu | ....................... G02B 6/0036 362/146 |
| 7,572,994 B2 | * | 8/2009 | Jung | ............................. 200/310 |
| 7,841,791 B2 | * | 11/2010 | Iso | ............................. 400/491.2 |
| 8,322,905 B2 | * | 12/2012 | Parker | ....................... F21V 5/00 362/23.09 |
| 2007/0257822 A1 | * | 11/2007 | Lee et al. | ......................... 341/22 |
| 2011/0122649 A1 | * | 5/2011 | Wen et al. | ..................... 362/606 |
| 2011/0147182 A1 | * | 6/2011 | Chen | ............................. 200/314 |
| 2011/0168537 A1 | * | 7/2011 | Yamada | ........................ 200/344 |

* cited by examiner

*Primary Examiner* — Anh Mai
*Assistant Examiner* — Arman B Fallahkhair
(74) *Attorney, Agent, or Firm* — Benesch, Friedlander, Coplan & Aronoff LLP

(57) ABSTRACT

A backlit system comprises a base panel, a plurality of keys disposed on the base panel, a substantially planar light guide panel disposed between the base panel and the plurality of keys, at least one light source disposed on the light guide panel, and at least one light management feature disposed on the light guide panel. The at least one light management feature is configured to at least partially reflect incident light within the light guide panel.

30 Claims, 19 Drawing Sheets

LIGHT GUIDE AND KEYBOARD BACKLIGHT

CROSS-REFERENCE TO RELATED APPLICATIONS

This application claims priority from U.S. Provisional Patent Application No. 61/610,456, filed on Mar. 13, 2012, which is incorporated by reference herein in its entirety.

BACKGROUND

Backlit keyboards have become increasingly common, enabling users to more easily view the keyboards in low-light settings. Backlit keyboards may be lit with a thin light guide panel placed beneath a base feature plate that supports the keys. The feature plate may be metal with multiple holes to allow light to pass through. Such light guide panels may include a thin optically transmissive sheet allowing light to pass from multiple light emitting diodes ("LEDs").

Placement of light-guide panels beneath the feature plate may result in loss of light due to the feature plate. Locating a light guide panel above the feature plate, allowing light to originate closer to the keys, may be problematic because such placement of a light guide panel must permit structure to anchor the keys to the feature plate and allow the key to interact with the feature plate to pass through the light guide panel. In some instances, each key would require between one and six holes in such a light guide panel that allow the anchoring structure to pass through the light guide panel, totaling several hundred holes over an entire standard keyboard.

SUMMARY

A backlit system comprises a base panel, a plurality of keys disposed on the base panel, a substantially planar light guide panel disposed between the base panel and the plurality of keys, at least one light source disposed on the light guide panel, and at least one light management feature disposed on the light guide panel. The at least one light management feature is configured to at least partially reflect incident light within the light guide panel.

A light guide comprises a substantially planar light guide panel. The light guide panel has a transparent layer, a substantially planar upper surface, a substantially planar lower surface opposite the upper surface, a perimeter surface, and a plurality of key switch holes extending through the light guide panel. The light guide further comprises at least one light source disposed on the light guide panel. The light guide further comprises at least one light management feature disposed on the light guide panel distal to at least one light source and configured to at least partially reflect incident light within the light guide toward at least one of the plurality of key switch holes.

An integrated light guide panel comprises a substantially planar light guide panel. The light guide panel has a transparent layer, a substantially planar upper surface, a substantially planar lower surface opposite the upper surface, a perimeter surface, and a plurality of key switch holes extending through the light guide panel. The integrated light guide panel further comprises at least one light source disposed on the light guide panel. The integrated light guide panel further comprises at least one light management feature disposed on the light guide panel distal to at least one light source and configured to at least partially reflect incident light within the light guide. The integrated light guide panel further comprises at least one light emission feature comprising at least one well, the light emission feature disposed under at least one key. The at least one well is configured to direct incident light at least partially toward the at least one key. The integrated light guide panel further comprises at least one set of printed circuit board leads configured to contact a key switch mechanism. The integrated light guide panel further comprises a set of printed circuit leads configured to supply power the at least one light source.

BRIEF DESCRIPTION OF THE DRAWINGS

In the accompanying drawings, structures are illustrated that, together with the detailed description provided below, describe example embodiments of the claimed invention. Where appropriate, like elements are identified with the same or similar reference numerals. Elements shown as a single component may be replaced with multiple components. Elements shown as multiple components may be replaced with a single component. The drawings may not be to scale. The proportion of certain elements may be exaggerated for the purpose of illustration.

DETAILED DESCRIPTION

Figure 1:
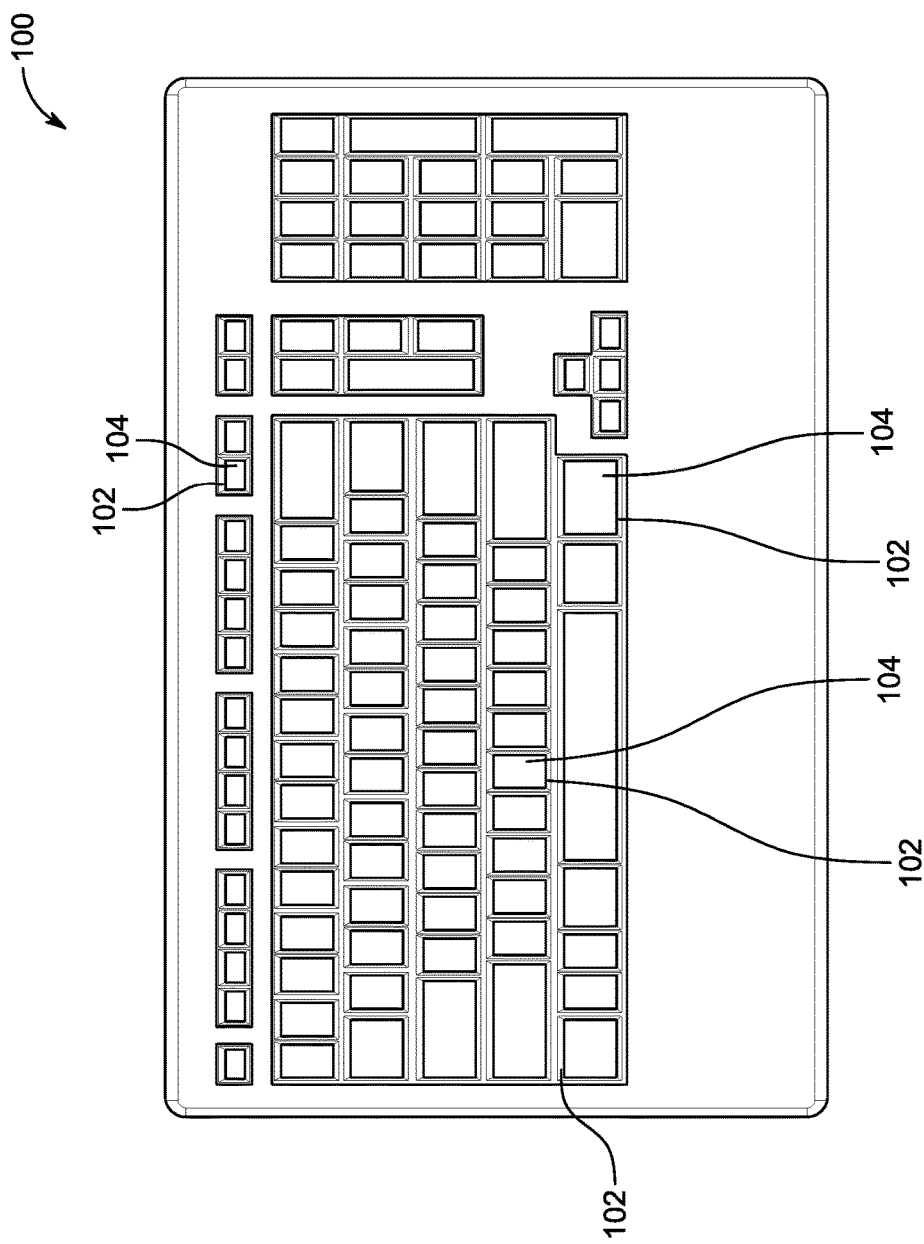
FIG. 1 illustrates an isometric view of a backlit keyboard according to one example of the present disclosure.

It will be appreciated that the illustrated boundaries of elements in the drawings represent only one example of the boundaries. One of ordinary skill in the art will appreciate that a single element may be designed as multiple elements or that multiple elements may be designed as a single element. An element shown as an internal feature may be implemented as an external feature and vice versa.

Further, in the accompanying drawings and description that follow, like parts are indicated throughout the drawings and description with the same reference numerals, respectively. The figures may not be drawn to scale and the proportions of certain parts have been exaggerated for convenience of illustration.

Certain terminology will be used in the following description for convenience in describing the figures will not be limiting. The terms "upward" or similar terms will be understood to refer to directions from the underside of the keyboard, toward the key tops of a keyboard, while terms such as "top," "above" or "over" will be understood to refer to relative positions closer to the key tops of a keyboard. The terms "downward" or similar terms will be understood to refer to directions toward the underside of the keyboard from the key tops of the keyboard, while terms such as "bottom," "below" or "under" will be understood to refer to relative positions closer to the underside of the keyboard.

It is one aspect of the present teachings to manage light travel around numerous holes within the core of a light guide panel and out of the light guide panel at desirable locations that, for example, illuminate keys to a user. In yet another aspect of the present teachings, the light is managed so to achieve a uniform lighting effect that is uniform from key to key regardless of the position of the light sources. In yet another aspect of the present teachings, the number of light sources necessary to illuminate a keyboard may be reduced as a result of the light management features disclosed herein.

FIG. 1 illustrates an isometric view of a backlit keyboard 100 according to one aspect of the present disclosure. Keyboard 100 has a plurality of keys 102 having key tops 104. The keyboard 100 is partially enclosed by an outer cover 106 that encloses the internal components (not shown) of the keyboard 100. It should be understood that, although the example figures illustrate backlit keyboards, the backlighting system described herein may be used in other suitable applications, such as keypads, and so on.

Figure 2:
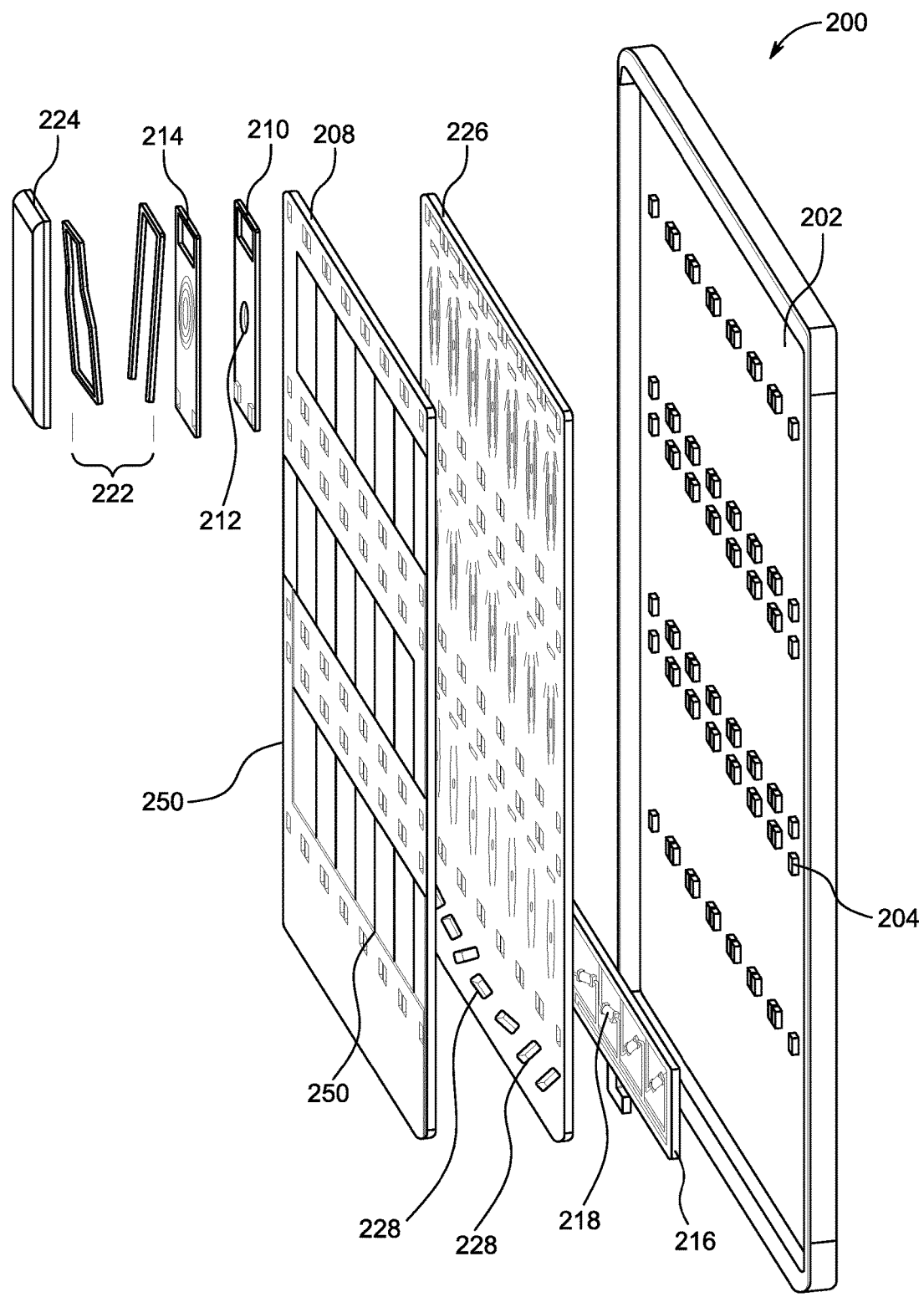
FIG. 2 illustrates a partial exploded view of a keyboard having a light guide panel according to one example of the present disclosure.

FIG. 2 illustrates a partial exploded view of a keyboard 200. A lower mounting plate 202 has mounts 204. A flexible printed circuit (FPC) board 216 is mounted to the underside of light guide panel 226. LEDs 218 serve as a light source, but other sources of light may be used. A switching layer 208 includes electronic printed circuitry 250 and contacts (not shown) and is mounted above light guide panel 226. In one aspect of the present teachings, switching layer 208 is at least partially transparent, and may be completely transparent. According to one aspect of the present teachings, spacer 210 can sit immediately above the switching layer 208. Nonconductive spacer 210 protects unwanted contact with circuit traces while permitting a conductive pill (not shown) found in key diaphragm 214 to make contact through hole 212. The conductive pill, on the underside of diaphragm 214, makes contact with the leads (not shown) on switching layer 208, completing a circuit identifying a key depression. Scissor-style mechanisms 222 are secured to mounts 204. Key cap 224 is mounted on top of mechanisms 222.

Light guide panel 226 is disposed above the mounting plate 202 and FPC board 216. According to one aspect of the present disclosure, the light guide panel 226 is planar. In yet other aspects, the light guide panel 226 may take three dimensional forms, such as a three dimensional curved surface. According to one aspect of the present teachings, the light guide panel 226 has light source holes 228 in which LEDs 218 located on FPC board 216 are mounted. According to one aspect of the present disclosure, different arrangements of light guide panels, conduction layers, FPC layers and any reflective layers are possible.

Figure 2A:
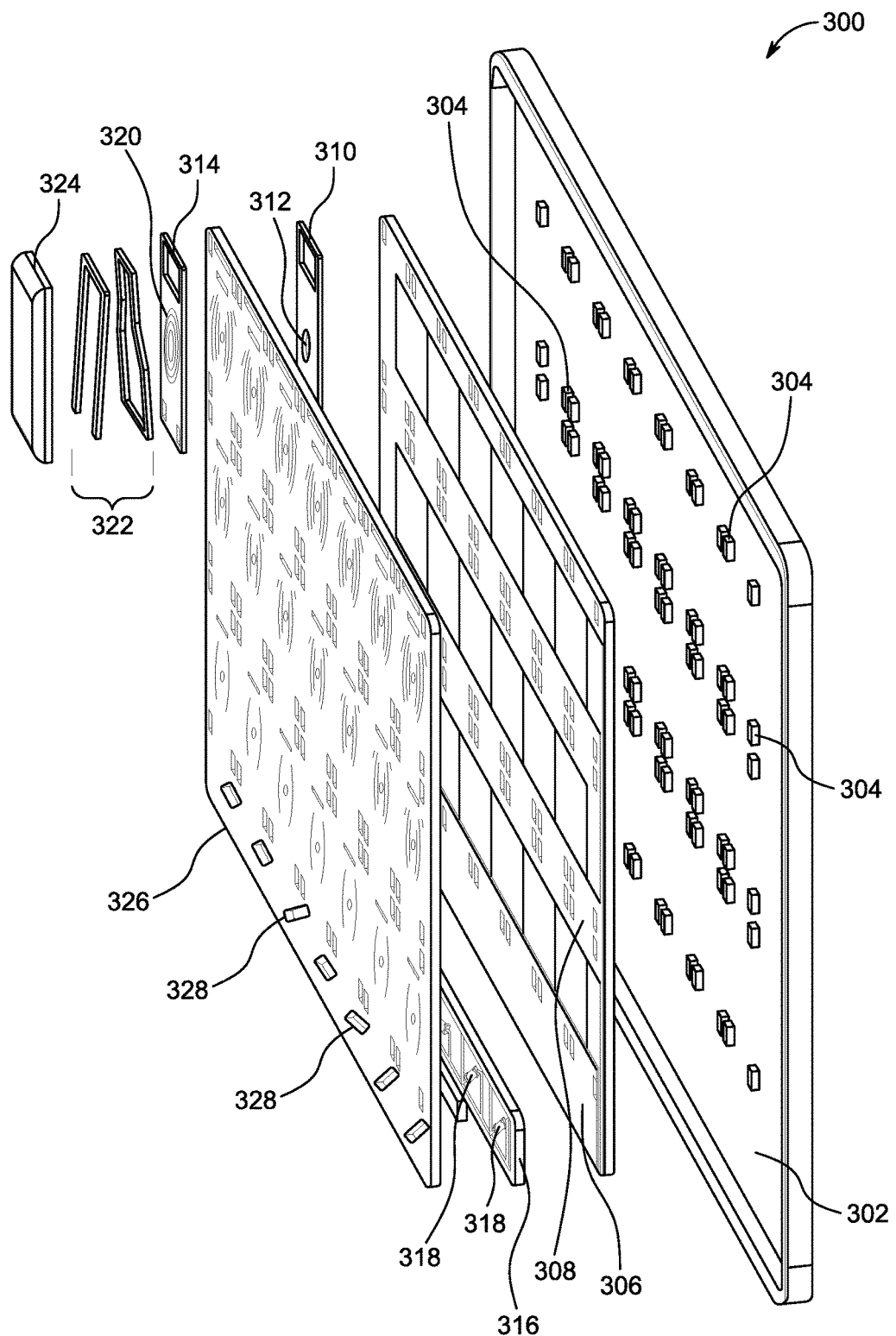
FIG. 2a illustrates a partial exploded view of a keyboard having a light guide panel according to one example of the present disclosure.

FIG. 2A illustrates a partial exploded view of another keyboard 300 having a light guide panel 326 according to the present disclosure. A lower mounting plate 302 has mounts 304. A base plate 306 having a switching layer 308 includes electronic printed circuitry and electrical contacts (not shown) that communicate to a computer or other electronic device which key has been pressed by the user. According to one aspect of the present teachings, a spacer 310 can sit immediately above the switching layer 308. Spacer 310 can be made of a relatively nonconductive material. According to another aspect of the present teachings, a nonconductive spacer may protect unwanted contact with circuit traces while permitting a conductive pill (not shown) found in key diaphragm 314 to make contact through hole 312.

A flexible printed circuit ("FPC") board 316 is mounted between switching layer 308 and light guide panel 326. In one aspect of the present disclosure, the FPC board 316 is secured to the switching layer 308. In another aspect of the present disclosure, the FPC board 316 is secured to the light guide panel 326. The FPC board 316 includes multiple light emitting diode ("LED") light sources 318. According to other aspects of the present disclosure, other sources of light may be used. Diaphragm 314 has a conductive pill (not shown) on its underside within dome 320 such that when a key is depressed, the pill makes contact with leads (not shown) on switching layer 308, completing a circuit identifying to the computer or other device which key has been depressed. Scissor-style links 322 are secured to mounts 304. Key cap 324 is mounted on top of scissors 322.

Light guide panel 326 is disposed above the mounting plate 302, switching layer 308, spacer 310 and FPC board 316. Diaphragm 314, scissors 322 and key top 324 are disposed above light guide panel 326. According to one aspect of the present disclose, the light guide panel 326 is planar. In yet other aspects, the light guide panel 326 may take three dimensional forms, such as a three dimensional curved surface. According to one aspect of the present teachings, the light guide panel 326 has light source holes 328 in which LEDs 318 located on FPC board 316 are mounted.

Figure 3:
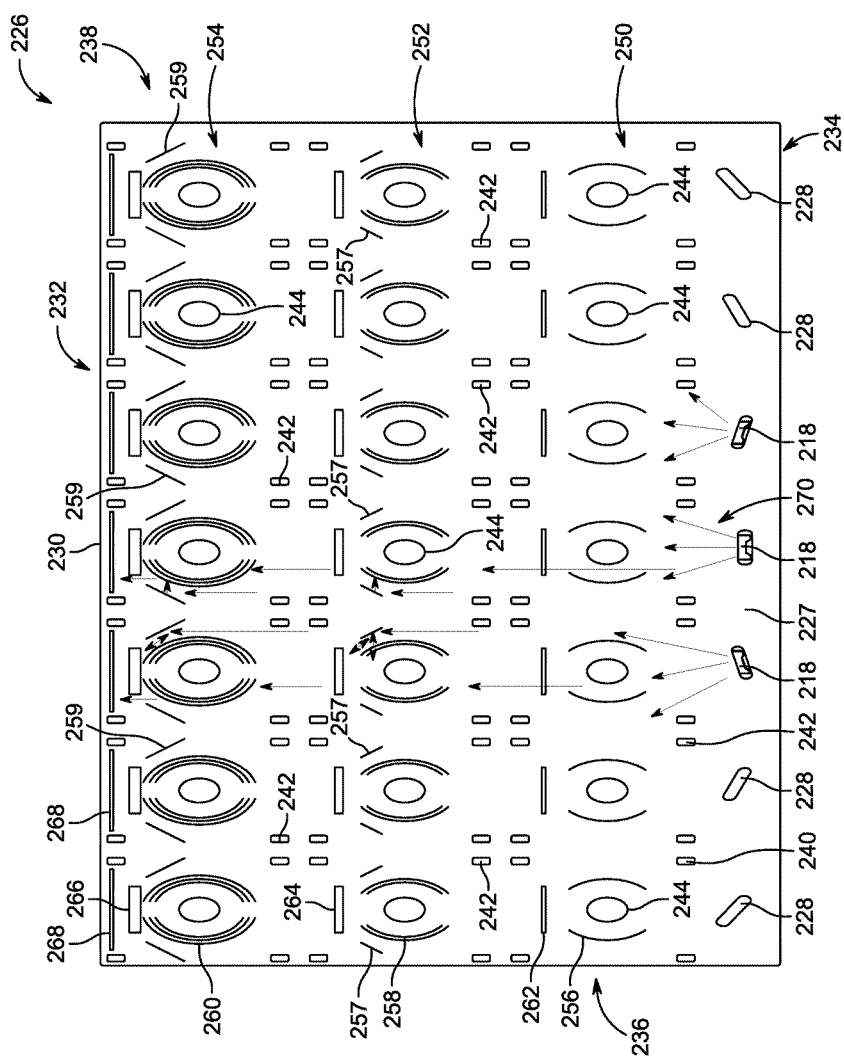
FIG. 3 illustrates a light guide panel according to one example of the present disclosure.

FIG. 3 illustrates a plan view from above an example light guide panel 226 of FIG. 2, with FPC board 216 mounted to the light guide panel 226. Light guide panel 226 has a planar upper surface 227, and planar lower surface (not shown) opposite the upper surface 227. Light guide panel 226 has a perimeter surface 230 that define first and second longitudinal ends 232, 234, and first and second lateral ends 236, 238. While the illustrated light guide panel 226 is rectangular in shape, the present teachings are not so limited. The light guide panel may have a perimeter 230 that defines other geometric shapes, curved shapes, or other forms. The light guide panel 226 has a plurality of key switch mechanism holes penetrating the light guide panel 226. In the illustrated light guide panel 226, the holes include scissor holes 242 through which the scissors 222 mount key tops 224 to mounting plate 202, and contact hole 244 through which the contact pill in the diaphragm 214 reaches the switching layer 208.

The illustrated light guide panel 226 includes seven LED holes 228 and three LEDs 218 disposed in holes 228. In another example, light guide panel 226 may include more or less LED holes 228 and more or less LEDs 218 disposed in respective holes. In the illustrated light guide panel 226, three LEDs 218 are centrally located adjacent the second longitudinal end 234. While the illustrated LEDs 218 are arranged along second longitudinal end 234, the light guide panel 226 may have light sources disposed at one or more of the first and second longitudinal ends 232, 234, first and second lateral ends 236, 238 or anywhere within the light guide panel 226. In one aspect of the present teachings, light sources can be placed centrally within the light guide panel 226. In another aspect, the light sources are placed along an axis located centrally between the first and second lateral ends 236, 238. Placement of light sources may be constrained by locations of LED holes 228. In yet another aspect of the present teachings, the light sources are placed along an axis located centrally between the first and second longitudinal ends 232. 234.

The illustrated light guide panel 226 is arranged to correspond to a keyboard having three rows of keys, 250, 252 and 254. First row 250 is closest to the LEDs 218, second row 252 is between the first 250 and third 254 rows, and the third row 254 is furthest from LEDs 218. The second 252 and third rows 254 have light management features 257 and 259 respectively, which at least partially reflect light within the light guide panel 226 toward an adjacent key, as shown by arrows 270 representing light rays in FIG. 3 emanating from the three centrally located LEDs 218. For example, the arrows 270 may be partially reflected toward light emission features discussed below.

Each of the rows 250, 252, and 254 have multiple light emission features. Specifically, each row 250, 252 and 254 has curved emission features 256, 258, 260, respectively, adjacent to and partially surrounding holes 244. The first row 250 has a curved emission feature 256 including a single row of individual light emission features in the form of localized wells or indentations having a particular depth, thereby exposing the core of light guide panel 226 and allowing light to escape the core of light guide panel 226, and for example be directed toward a key top which it illuminates. The curved emission features 258, 260 in the second and third row 252, 254 differ in having two and three, respectively, rows of wells. According to one aspect of the present teachings, the average depth of the wells of the light management features 257, 259 and curved emission features 256, 258, 260 increases with the distance between the light management features 257, 259 or curved emission features 256, 258, 260 on the one hand, and LEDs 218 on the other. In addition to the curved emission features, each of the three rows in FIG. 3 includes linear light emission features 262, 264, 266 adjacent to holes 244 and distal to the LEDs 218 relative to their respective adjacent holes 244. The linear features 262, 264, 266 also increase in the number of rows from first row 250 to third row 254. In addition, the linear features 262, 264, 266 are made up of individual wells the depth of that increase from first row 250 to third row 254. According to another aspect of the present teachings, the length of each of the linear and curved light emission features may vary. According to another aspect of the present teachings, such variation may be increasing length as the distance from light sources increases.

Additional light management features in the form of a light dam 268 are arranged along first longitudinal end 232, on the opposite or distal side relative to LEDs 218, in order to redirect light that would otherwise escape from the first longitudinal end 232 back into the light guide panel 226. In one aspect of the present teachings, the light dams 268 are slots that have been cut through the entire thickness of the thin light guide panel 226.

In addition to the light guide panel 226 shown in FIGS. 2-3, the light guide panel 326 in FIG. 2A can also include the features described above with respect to light guide panel 226 shown in FIG. 3.

Figure 4:
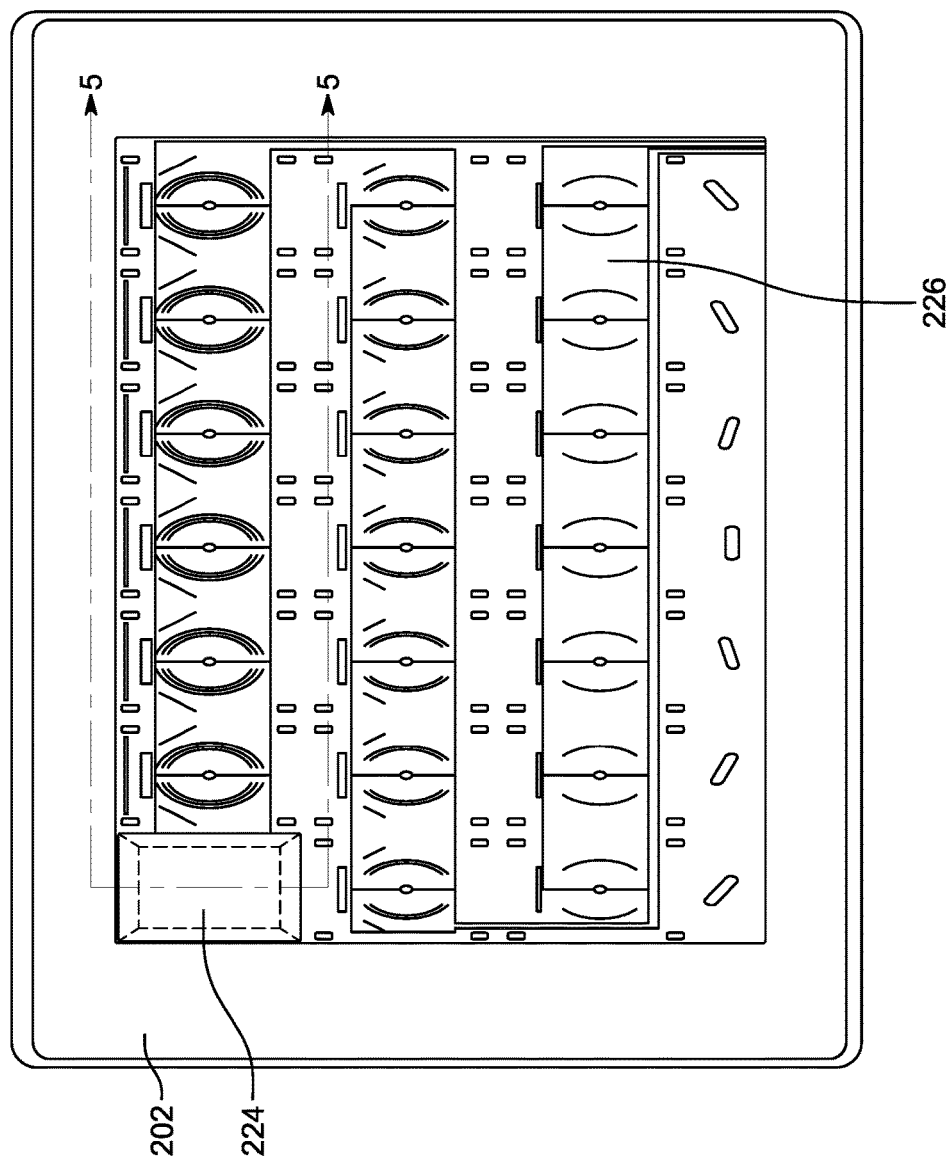
FIG. 4 illustrates a top view of a partially assembled keyboard according to one example of the present disclosure.
Figure 5:
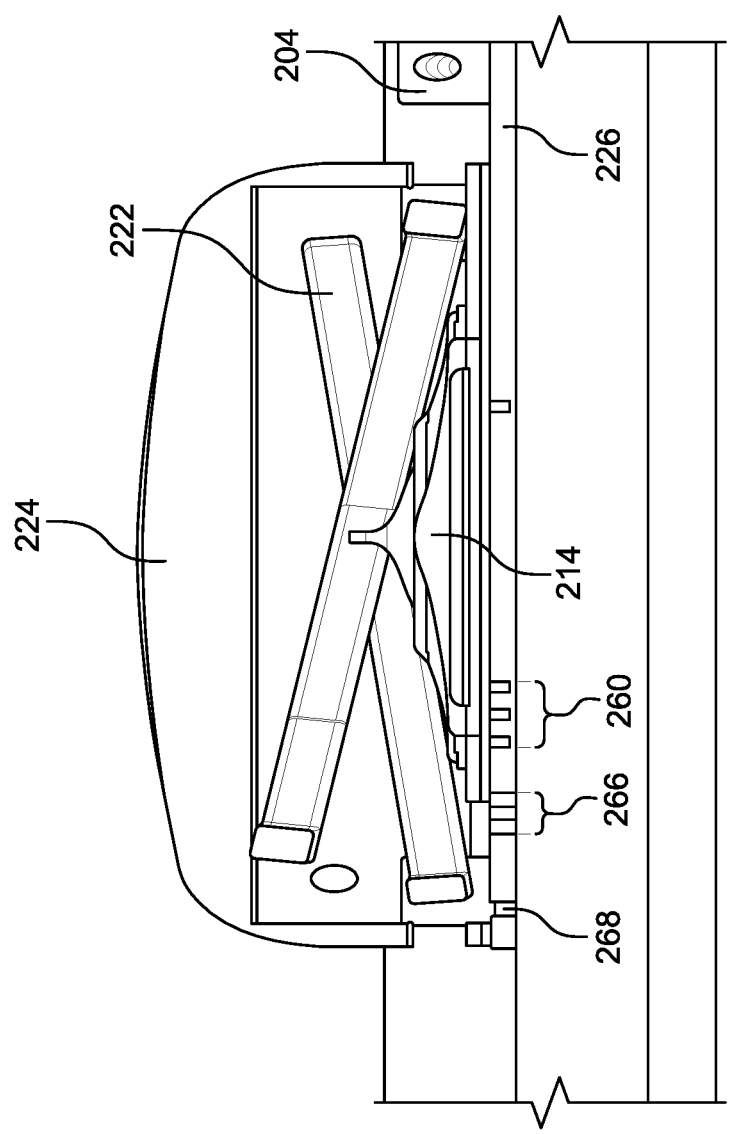
FIG. 5 illustrates a cross-sectional side view of a partially assembled keyboard according to one example of the present disclosure.

Referring back to FIG. 2, it will be noted that the light guide panel 226 may be mounted advantageously below the switching layer 208. In addition, as will be further discussed below, traces of switching layer 208 may be printed on the light guide panel 226. In yet another aspect of the present teachings, the traces are printed on top of the light guide panel 226. FIG. 4 shows a top view of a partially assembled alternative embodiment of a keyboard showing the components in FIG. 2 assembled. As shown, the light guide panel 226 is mounted above the switching layer 208. FIG. 5 illustrates a cross-sectional side view of the partially assembled keyboard along the line 5-5 shown in FIG. 4. As illustrated in FIG. 5, the light dam 268 light management feature extends completely through light guide panel 226. Emission features 260 extend partially through the light guide panel 226, and emission features 266 extend completely through the light guide panel 226. FIG. 5 further illustrates Key cap 224 mounted on top of mechanisms 222, which is secured to mount 204.

Figure 6:
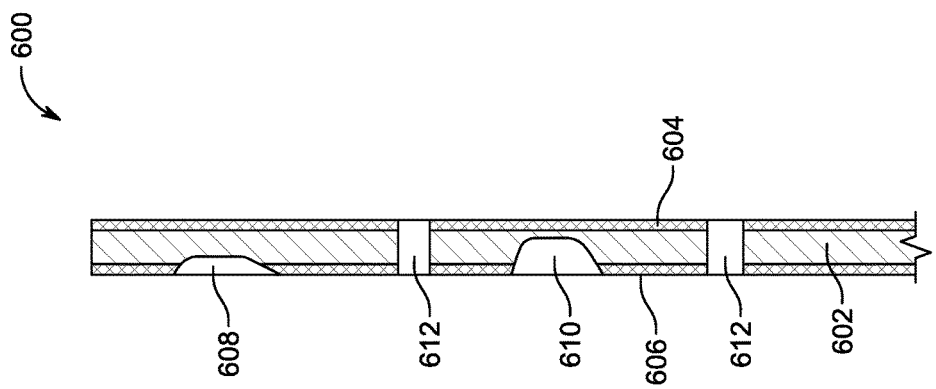
FIG. 6 illustrates a cross sectional view of an example light guide according to one example of the present disclosure.

A light guide panel includes one or more light guides. FIG. 6 illustrates a cross sectional view of an example light guide 600. Light guide 600 may be a cross section of an optical fiber having a core and cladding, which in one aspect of the present teaching is drawn into a flat shape as a planar light guide; or, alternatively may be a different planar form; or, alternatively may take a variety of planar forms of an optical wave guide that does not use a separate cladding. Whether in the form of a fiber or planar, or other form, according to one aspect of the present teachings, the light guide 600 includes a core 602 through which light passes and cladding layers 604, 606 which maintain internal reflectance of light within the core 602. In addition to or in lieu of the illustrated cladding layers 604, 606, a reflective layer (not shown) may be placed along all or part of surfaces enclosing the core 602. In one aspect of the present disclosure, a light guide 600 may also be plain in nature, and use air as a cladding. In one aspect of the present disclosure, a plurality of light guides 600 in the form of optical fibers may be used to illuminate a keyboard. Light guide features 608 and 610, or light management features, have differing depths, both of which extend into the core 602. Holes 612 permit key mechanism (e.g., scissor elements) to extend from the key top to the mounting base of a keyboard. The light guide features 608, 610 can form wells that expose a portion of the transparent core layer 602. Light guide features 608 and 610 may be formed through laser etching, die-cutting, mechanical abrasion, molding or other manufacturing processes. These processes can disrupt the surface of the light guide 600, and eliminate the need for printing light coupling surface treatments on the surface of the light guide. The disruptions need not be of any particular shape. Disruption of the surface can suffice to cause light to exit the light guide 600 or redirect the light in a desired way. In addition, existing methods of extracting light from a plain wave guide can be used in concert with these methods. These extraction methods include the use of higher index material than the core, coated or printed on the surface. These coatings can couple light out of the core of a plain wave guide in selected locations.

Figure 7:
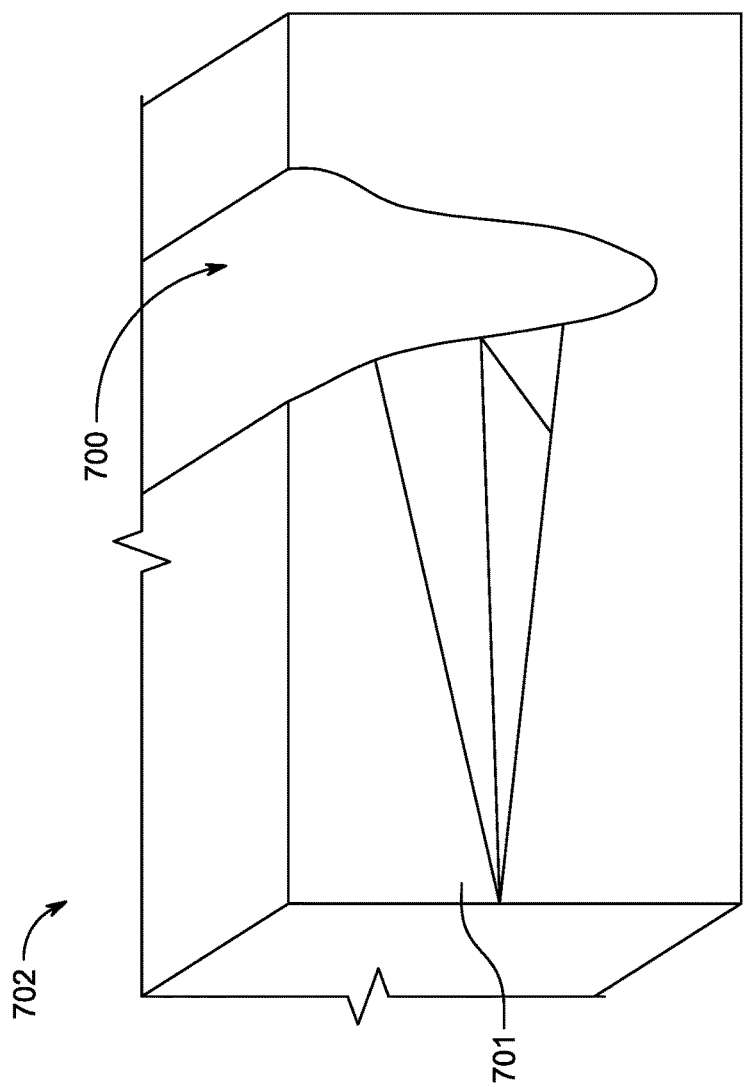
FIG. 7 illustrates a cross section view of a light guide feature of a light guide panel according to one example of the present disclosure.

FIG. 7 illustrates a cross section view of an example light guide feature 700 of an example light guide panel 702. As illustrated, light guide feature 700 may be configured to at least partially redirect light within a light guide core 701 of light guide panel 702. In other aspects of the present teachings, light guide feature 700 may be configured to emit light out of a light guide core 701, and for example toward a keyboard user. The light guide features 700 may be elongate such as the channel shown in FIG. 7. In another example, light guide feature 700 may be localized such as a well with a circular or geometric shaped opening (not shown). Multiple light guide features may be interspersed over particular areas to emit or redirect light within a core.

Figure 8:
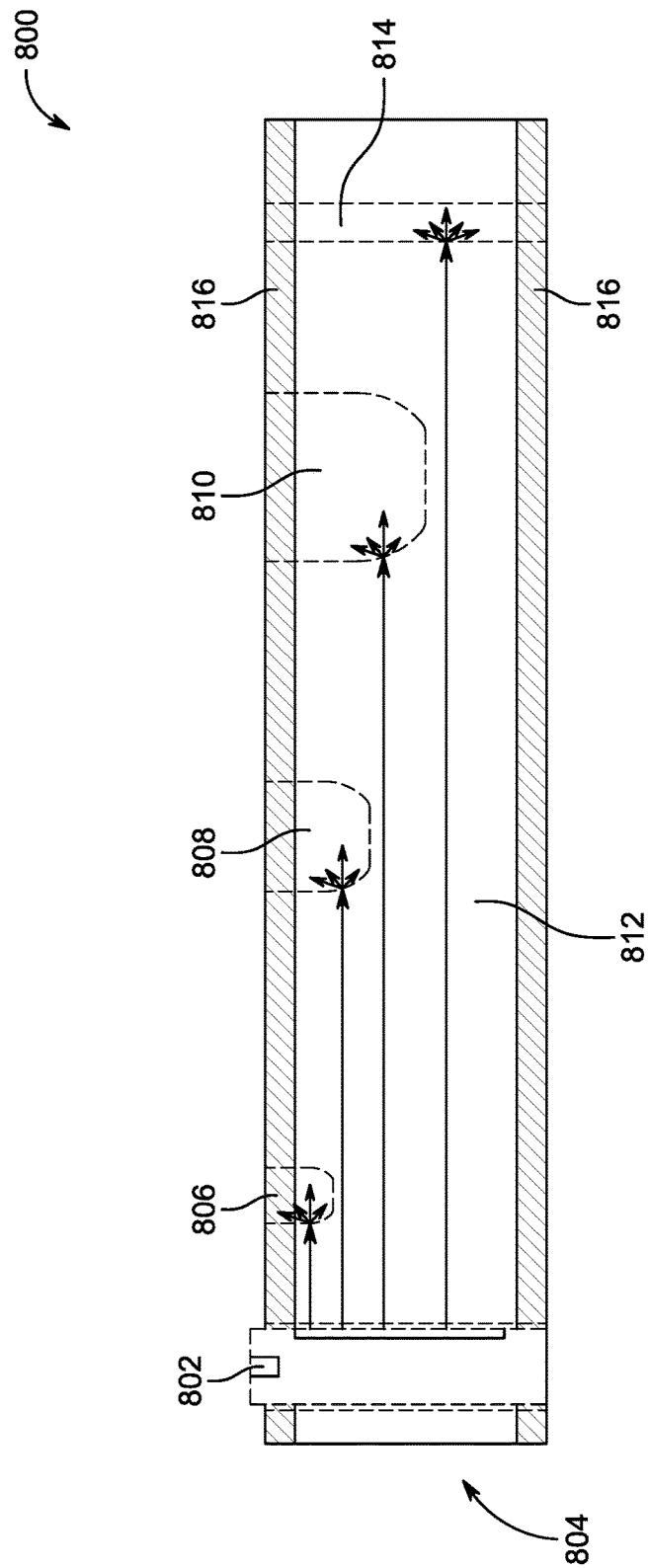
FIG. 8 illustrates a side cross-sectional view of a light guide according to one example of the present disclosure.

FIG. 8 illustrates a side cross-sectional view of an example light guide 800 having a light source 802 at a first end 804. Progressively deeper and wider light guide features 806, 808, 810 may redirect light within core 812 or out toward the user, or a combination or both. Light passes through core 812 material underneath one or more of the features 806, 808, 810. Light passing the last feature 810 may meet a light dam 814 redirecting light back into the core 812 where it can contribute to increasing brightness of the light guide 800. Core 812 is surrounded by cladding layers 816.

As illustrated in FIGS. 9A-9I and 10A-10F, light guide features may be linear, curved, or may take a variety of different geometric shapes. Shapes such as circles ovals, squares, parallelograms, or other closed two dimensional shapes may be cut out of the light guide panel, or formed by light guide features that are extending partially through a light guide panel. According to one aspect of the present teaching, light guide features such as those shown in FIGS. 9A-9I and 10A-10F at least partially redirect light within the core of a light guide panel. In another aspect of the present teachings, such light guide features at least partially emit incident light out of the light guide panel. According to aspects of the present disclosures, light management features may include elongate channels having one or more of a linear portion, a curved portion, both a linear portion and a curved portion. In another aspect, the light management feature includes an elongate slot. Such slots can serve as light dams, redirecting a substantial amount of light back into the light guide panel. Such slots can be linear, curved, or both, or may have a variety of other shapes, including a tear-drop shape.

Figure 9C:
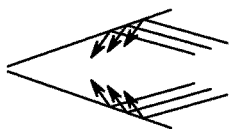
FIG. 9C illustrates an example triangle-shaped surface light guide feature for modifying a path of light.
Figure 9F:
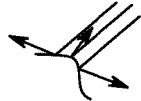
FIG. 9F illustrates an example combination shaped and curved light guide feature for modifying a path of light.
Figure 9I:
FIG. 9I illustrates an example combination straight line and curved line light guide feature for modifying a path of light.
Figure 9B:
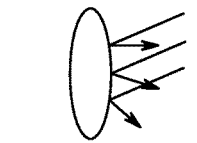
FIG. 9B illustrates an example oval-shaped surface light guide feature for modifying a path of light.
Figure 9E:
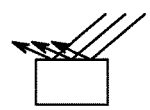
FIG. 9E illustrates an example square-shaped surface light guide feature for modifying a path of light.
Figure 9H:
FIG. 9H illustrates an example straight line light guide feature for modifying a path of light.
Figure 9A:
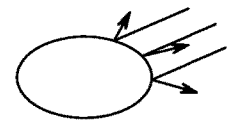
FIG. 9A illustrates an example circle-shaped surface light guide feature for modifying a path of light.
Figure 9D:
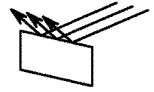
FIG. 9D illustrates an example parallelogram-shaped surface light guide feature for modifying a path of light.
Figure 9G:
FIG. 9G illustrates an example curbed line light guide feature for modifying a path of light.
Figure 10C:
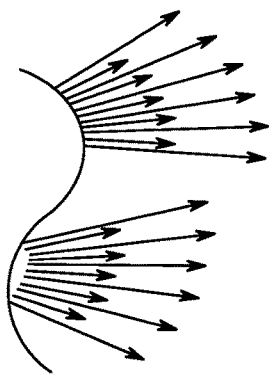
FIG. 10C illustrates an example light management feature for modifying light.
Figure 10F:
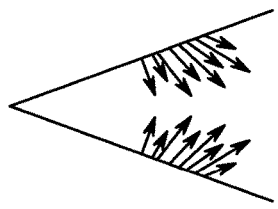
FIG. 10F illustrates an example light management feature for modifying light.
Figure 10B:
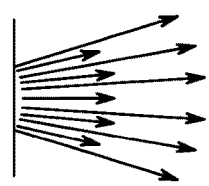
FIG. 10B illustrates an example light management feature for modifying light.
Figure 10E:
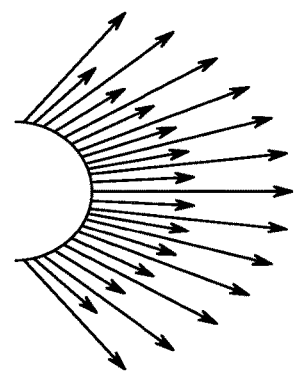
FIG. 10E illustrates an example light management feature for modifying light.
Figure 10A:
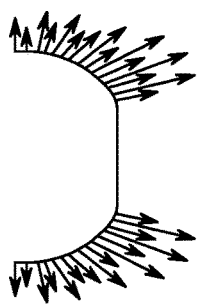
FIG. 10A illustrates an example light management feature for modifying light.
Figure 10D:
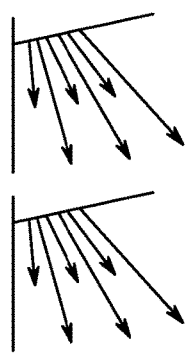
FIG. 10D illustrates an example light management feature for modifying light.

FIG. 9A illustrates an example circle-shaped surface light guide feature for modifying a path of light. FIG. 9B illustrates an example oval-shaped surface light guide feature for modifying a path of light. FIG. 9C illustrates an example triangle-shaped surface light guide feature for modifying a path of light. FIG. 9D illustrates an example parallelogram-shaped surface light guide feature for modifying a path of light. FIG. 9E illustrates an example square-shaped surface light guide feature for modifying a path of light. FIG. 9F illustrates an example combination shaped and curved light guide feature for modifying a path of light. FIG. 9G illustrates an example curbed line light guide feature for modifying a path of light. FIG. 9H illustrates an example straight line light guide feature for modifying a path of light. FIG. 9I illustrates an example combination straight line and curved line light guide feature for modifying a path of light.

FIGS. 10A-F illustrate various example light management features for modifying light.

Figure 11:
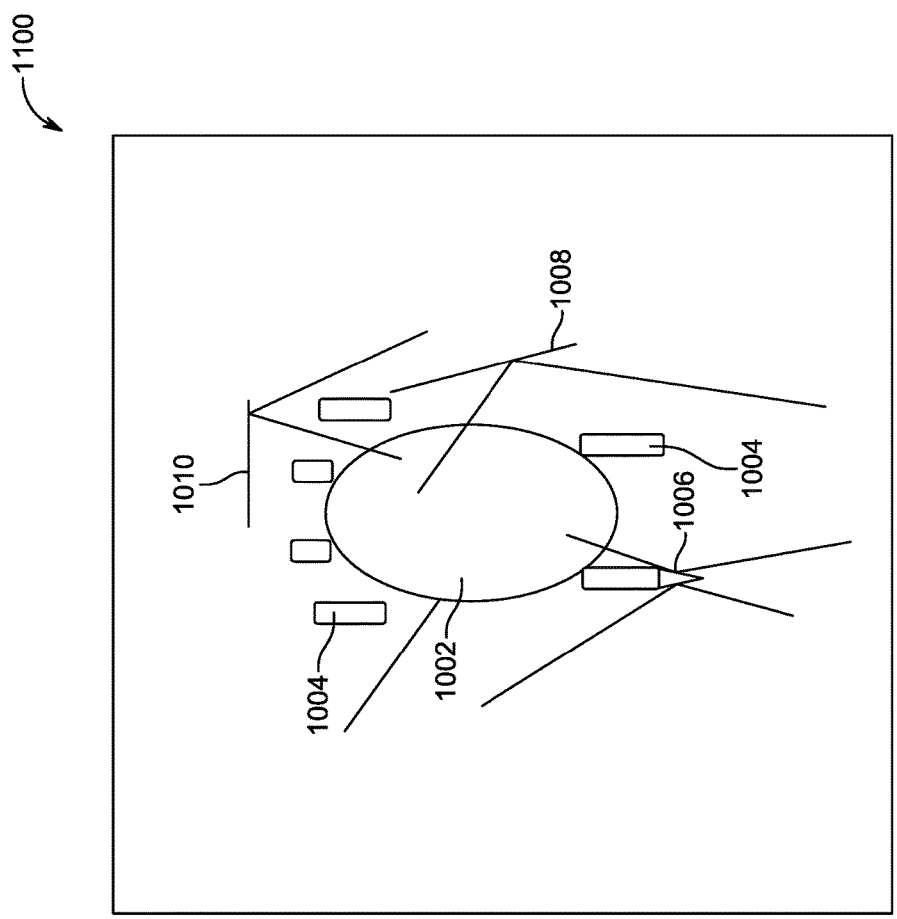
FIG. 11 illustrates a top view of a cut-out portion of a light guide panel according to one example of the present disclosure.

FIG. 11 illustrates a top view of a cut-out portion of a light guide panel 1100 surrounding light extraction feature 1102 and mechanism openings 1104. Light extraction feature 1102 may permit a conducting element to join two leads on an opposite side of the light guide panel 1100. In one aspect of the present teachings, light extraction feature 1102 also serves as a light emitting feature, redirecting incident light toward a key top. Key switch mechanism openings 1104 may permit a scissor mechanism to extend from a key cap to mounts extending from a mounting plate, like those illustrated in FIG. 2, for example. Light sources (not shown) are located within the plane of the light guide panel 1100, toward the lower portion of FIG. 11. Light redirection feature 1106 guides light away from mechanism openings 1104, where light would otherwise be emitted with little resulting increased brightness in a keyboard. Such incident light is instead redirected. As described, light redirection feature 1106 may be any suitable shape, including circle, square, and so on, even though the example light redirection feature 1106 is illustrated as having a triangle shape. Additional light redirecting features 1108 and 1110 are linear and are positioned at different angles within the light guide panel 1100. Light redirecting features 1108 and 1110 redirect light toward feature 1102, thereby illuminating a key cap.

Figure 12:
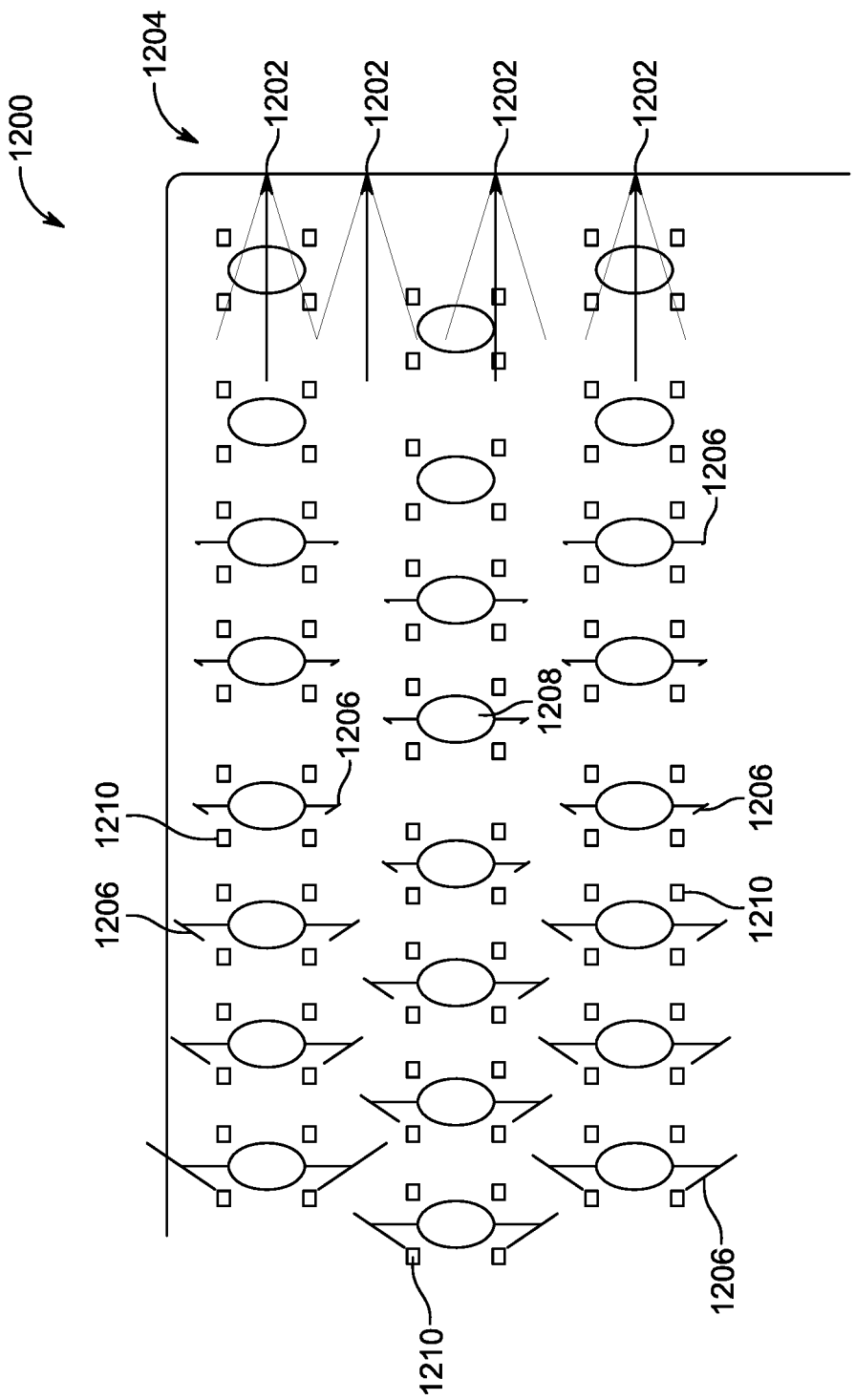
FIG. 12 illustrates a light guide panel according to one example of the present disclosure.

FIG. 12 illustrates a light guide panel 1200 according to one aspect of the present teachings. Light sources 1202 are disposed along a lateral edge 1204. According to one aspect of the present teachings, light management features 1206 increase in one or both of length and depth as the distance from the light sources 1202 increases. The light management features 1206 redirect light toward feature 1208 which is positioned under a key cap. Feature 1208 may be a hole, or may be exclusively a light emitting feature. Feature 1208 emits the light toward the keycap and illuminates the keycap. In yet other aspects of the present teachings, additional light management features can be disposed in light guide panel 1200 that redirect light around the key switch holes 1210. As will be illustrated in FIG. 13, such light management features could increase in depth, length or both as their distance from the light sources at the lateral edge increased.

According to one aspect of the present teachings, the light management features' depth and length follow an algorithm including exponential and polynomial terms. According to one aspect, the equation describing the depth of the light management features will be of the form:

$$\text{Depth} = A*e\exp(B*x) + C*x\exp 2 + D*x + E \text{ where:}$$

Depth: depth, in percentage of total thickness, of a light management feature;
x: distance from light source, measured in linear fashion;
A: Constant selected between 0 and 5;
B: Constant selected between 0 and 1;
C: Constant selected between 0 and 5;
D: Constant selected between 0 and 5; and
E: Constant selected between 0 and 100.

According to another aspect of the present teachings, the equation describing the length of the light management features will be of the form:

$$\text{Length} = A*e\exp(B*x) + C*x\exp 2 + D*x + E, \text{ where:}$$

Length: length, in suitable linear measures, of a light management feature;
x: distance from light source, or other lighting feature, measured in linear fashion;
A: Constant selected between 0 and 25;
B: Constant selected between 0 and 2;
C: Constant selected between 0 and 10;
D: Constant selected between 0 and 35; and
E: Constant selected between 0 and 100.

Figure 13:
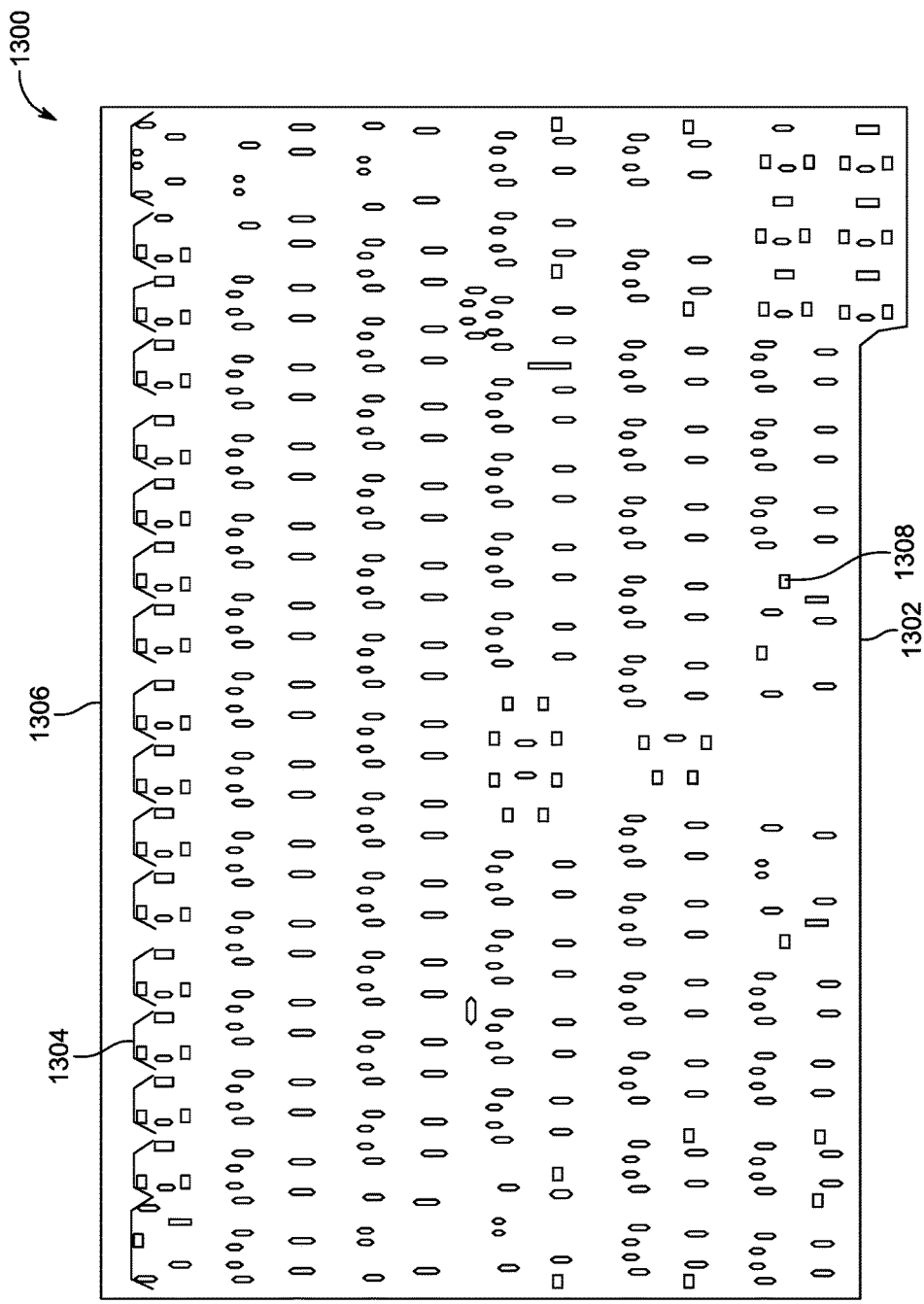
FIG. 13 illustrates a light guide panel according to one example of the present disclosure.

FIG. 13 illustrates another example light guide panel 1300. Light sources (not shown) are disposed along the longitudinal edge 1302, while light management features 1304 are disposed at the opposite longitudinal edge 1306. Light management features 1304 are distal to the light sources relative to a plurality of key switch holes 1308. Light management features 1304 serve to redirect light back into the core of the light guide panel 1300. In addition to the illustrated light management features 1304, additional light management features that at least partially redirect light can be placed adjacent any of the key switch holes 1308, and can be configured to redirect light in a desirable direction, whether toward a particular one of the holes 1308 or away. In addition, holes 1308 themselves may be configured to act as light management features.

Figure 14:
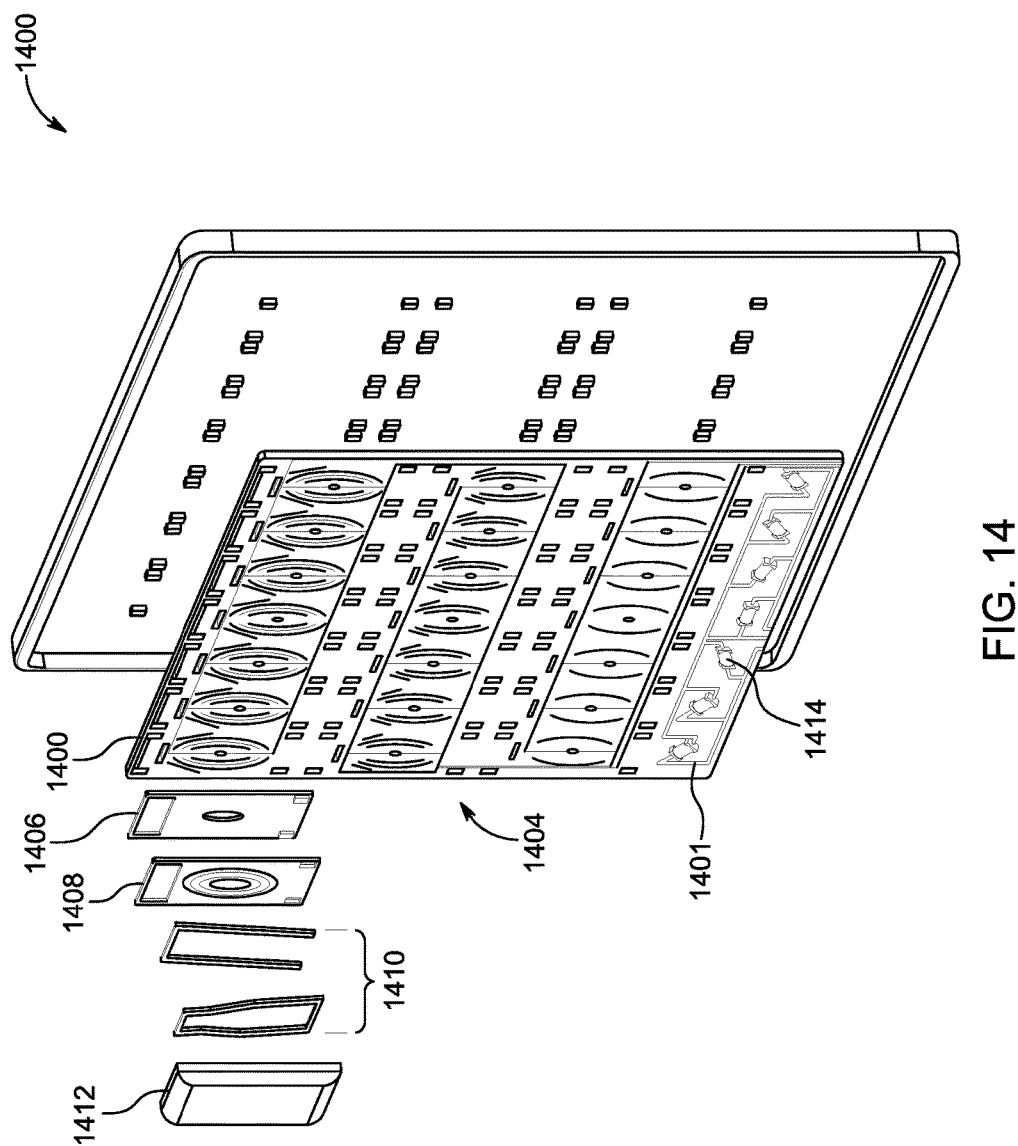
FIG. 14 illustrates a partial exploded view of a keyboard according to one example of the present disclosure.

FIG. 14 illustrates a partial exploded view of an example keyboard 1400. FIG. 14 illustrates an integrated panel 1401 including functionality of a light guide layer and a base plate or a conducting layer. The integrated panel 1401 includes electronic printed circuitry and contacts that communicate to a computer or other electronic device when a key has been pressed by the user. A spacer 1406, which can be transparent, can sit immediately above the integrate panel 1401. Diaphragm 1408, scissors 1410, and key cap 1412 are similar to those referred to in FIG. 2.

In the illustrated integrated panel 1401, a reflective layer (not shown) is disposed on the underside 1404 of the integrated panel 1401. For example, such a reflective layer may be positioned adjacent to a core of a light guide layer, or adjacent a cladding surrounding a core of a light guide layer. LEDs 1414 may be incorporated into the integrated panel 1401, for example by mounting an FPC underneath the reflective layer, or alternatively, above the light guide layer, allowing LEDs to be mounted to the integrated panel 1401.

Figure 15:
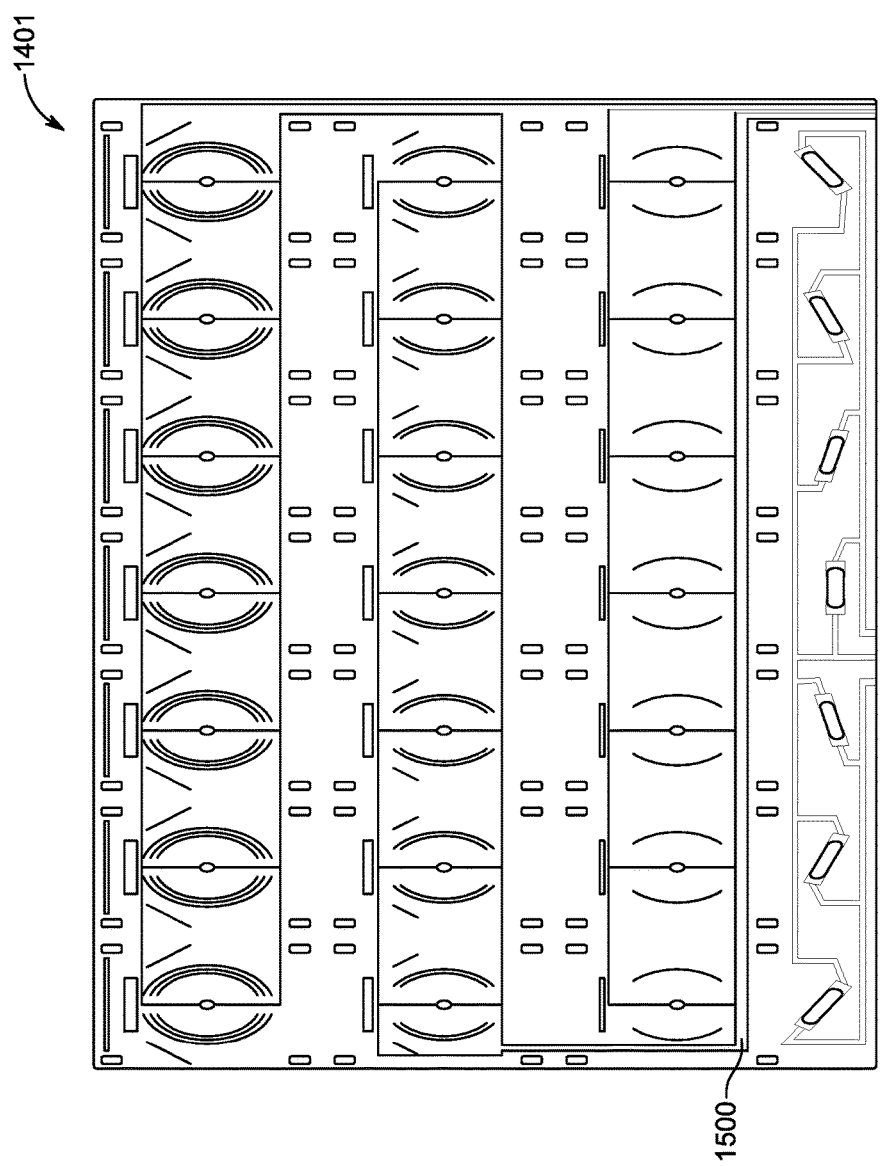
FIG. 15 illustrates a top view of an integrated light guide panel according to one example of the present disclosure.
Figure 16:
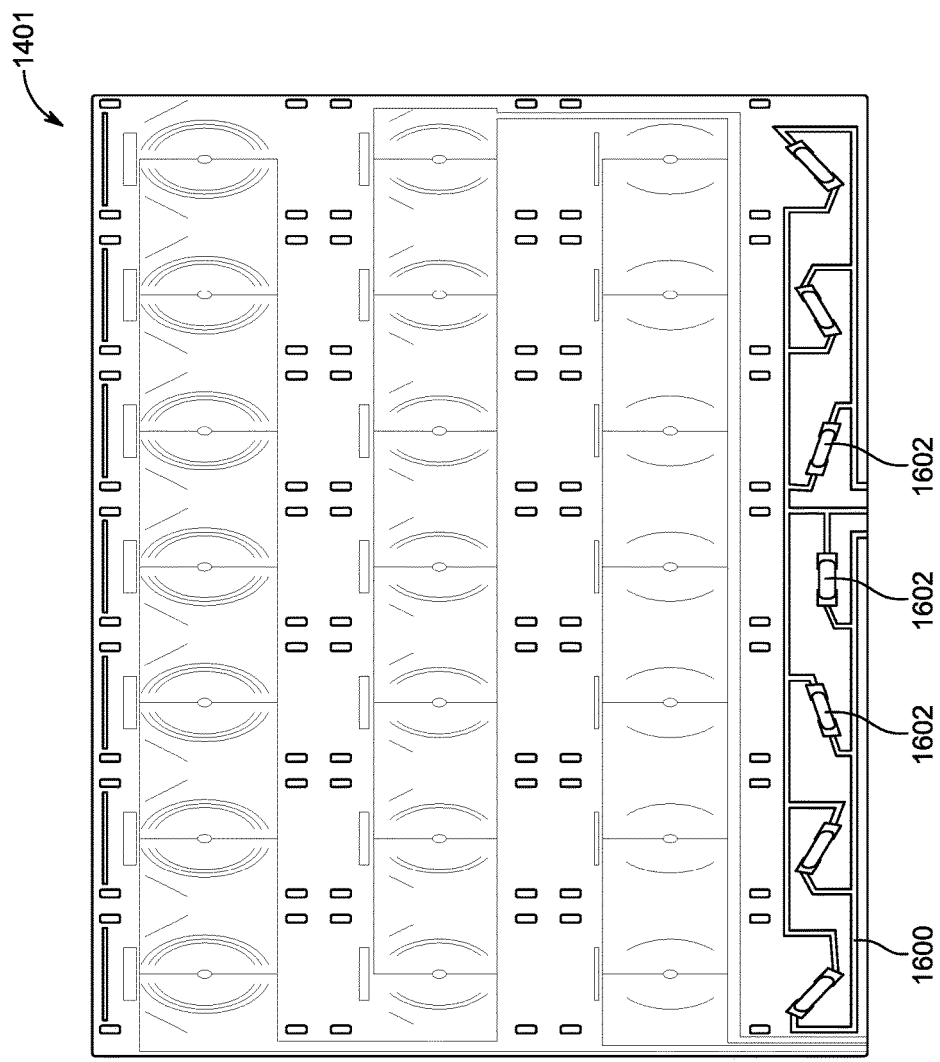
FIG. 16 illustrates a bottom view of an integrated light guide panel according to one example of the present disclosure.

FIGS. 15-16 illustrate the top and bottom plan view, respectively of the integrated light guide panel 1401 of FIG. 14 with features on opposite sides shown in silhouette form. With reference to FIG. 15, conducting traces 1500 are printed on the top of the integrated layer above the top layer of the light guide panel 1401. These traces 1500 will serve to communicate the computer or other electronic device which key has been depressed, eliminating the need for a separate conduction layer.

With reference to FIG. 16, printed circuitry 1600 such as provided by an FPC is secured to the underside or top side of integrated panel 1401. The printed circuitry provides power to LEDs 1602.

Figure 17:
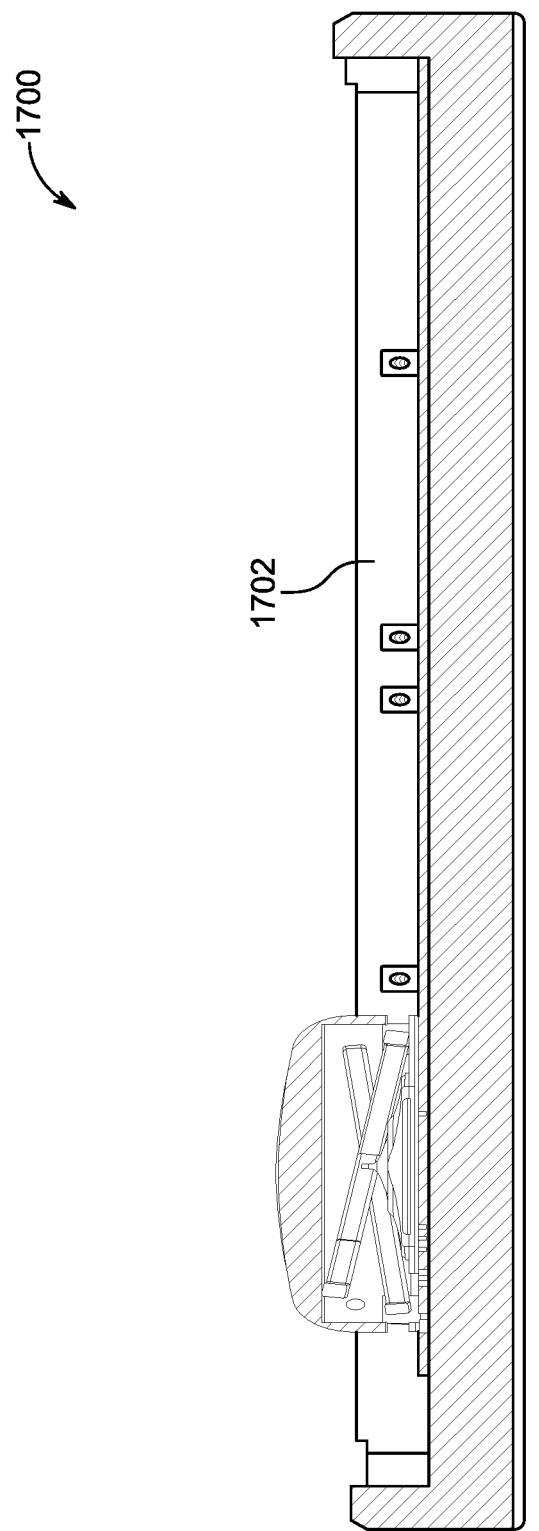
FIG. 17 illustrates a side view of a keyboard according to one example of the present disclosure.

FIG. 17 illustrates a side view of an example keyboard 1700 having a light guide panel 1702.

Figure 18:
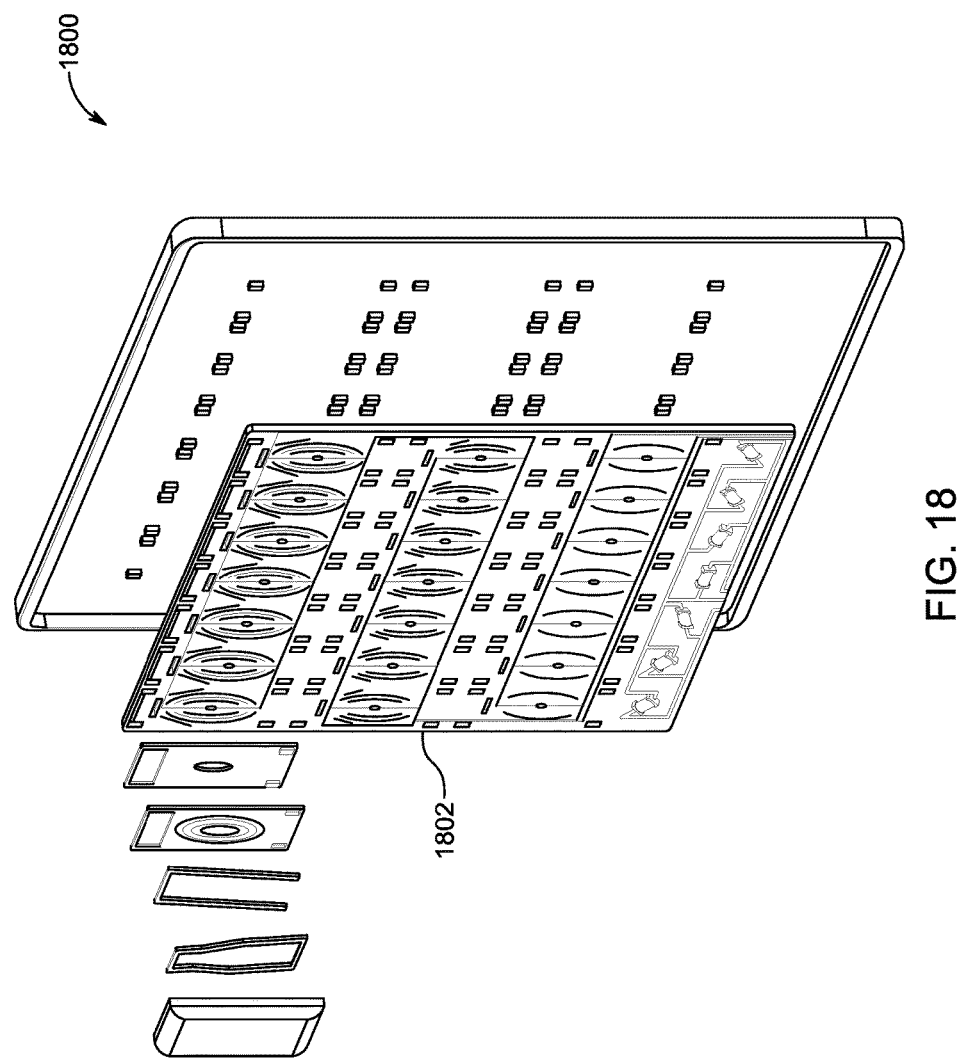
FIG. 18 illustrates a fully integrated keyboard assembly according to one example of the present disclosure.

FIG. 18 illustrates an example fully integrated keyboard assembly 1800. A single component layer 1802 fully integrates a switch layer, a light guide panel, a reflector, an FPC, and LEDs.

For the purposes of this disclosure and unless otherwise specified, "a" or "an" means "one or more." To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or multiple components. As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term. From about X to Y is intended to mean from about X to about Y, where X and Y are the specified values.

While the present disclosure illustrates various embodiments, and while these embodiments have been described in some detail, it is not the intention of the applicant to restrict or in any way limit the scope of the claimed invention to such detail. Additional advantages and modifications will readily appear to those skilled in the art. Therefore, the invention, in its broader aspects, is not limited to the specific details and illustrative examples shown and described. Accordingly, departures may be made from such details without departing from the spirit or scope of the applicant's claimed invention. Moreover, the foregoing embodiments are illustrative, and no single feature or element is essential to all possible combinations that may be claimed in this or a later application.

The invention claimed is:

1. A system comprising:
    a base panel;
    a plurality of keys disposed on the base panel;
    a substantially planar light guide panel disposed between the base panel and the key, wherein the substantially planar light guide panel comprises the plurality of keys switch hole extending therethrough and positioned underneath each of the plurality of keys;

a light source disposed on the light guide panel and configured to generate a light;
a plurality of curved light emission features; each of the plurality of curved light emission features disposed under a key of the plurality of the keys and comprising a plurality of wells, wherein the plurality of wells are arranged relative to the key switch hole such that the plurality of wells substantially surround the key switch hole, wherein the plurality of wells are configured to direct a portion of the light toward the key; and
a plurality of light management features disposed on the light guide panel, each of the plurality of the light management features configured to partially reflect incident light within the light guide panel towards the plurality of wells of one of the curved light emission features and partially reflect the incident light within the light guide panel away from another one of the curved light emission features.

2. The system of claim 1,
wherein each key switch hole extends therethrough and is positioned underneath a respective key of the plurality of keys; and
wherein each of the plurality of curved light emission features is arranged relative to a respective key switch hole such that each of the curved light emission features is adjacent to and substantially surrounds the respective key switch hole.

3. The system of claim 2, wherein a first curved light emission feature of the plurality of curved light emission features comprises a greater number of wells than a second curved light emission feature of the plurality of curved light emission features and less than a third curved light emission feature of the plurality of curved light emission features.

4. The system of claim 3, wherein a depth of the plurality of wells increases as a distance of the plurality of wells increases relative to the light source.

5. The system of claim 1, wherein the plurality of wells are further configured to direct incident light at least partially toward a respective key.

6. The system of claim 5, wherein a cross-sectional shape of a respective well comprises one of a triangle shape, a square shape, and a u-shape.

7. The system of claim 5:
wherein the substantially planar light guide panel comprises a substantially planar upper surface, a substantially planar lower surface opposite the upper surface, and a transparent layer disposed between the substantially planar upper surface and the substantially planar lower surface;
wherein the substantially planar upper surface is an optical transparent clad surface;
wherein the substantially planar lower surface is an optical transparent clad surface; and
wherein the plurality of wells are configured to expose at least a portion of the transparent layer.

8. The system of claim 5, wherein the plurality of curved light emission features comprise a depth of between 0% and 100% of the thickness of the substantially planar light guide panel.

9. The system of claim 5, wherein the plurality of curved light emission features comprise a cut-out disposed under the key.

10. The system of claim 5, wherein a depth of a first curved light emission feature of the plurality of curved light emission features is disposed at a first distance from the light source is less than the depth of a second curved light emission feature of the plurality of curved light emission features is disposed at a second distance, greater than the first distance, from the light source.

11. The system of claim 5, wherein a length of a first curved light emission feature of the plurality of curved light emission features is disposed at a first distance from the light source is less than the length of a second curved light emission feature of the plurality of curved light emission features is disposed at a second distance, greater than the first distance, from the light source.

12. The system of claim 5, wherein the plurality of light management features and the plurality of curved light emission features are disposed in the substantially planar light guide panel by one of laser etching, mechanical etching, chemical etching, die-cutting, mechanical abrasion, and molding.

13. The system of claim 5, wherein the plurality of curved light emission features are disposed on the light guide panel by surface coating a plain wave guide.

14. The system of claim 1,
wherein each key switch hole extends through the substantially planar light guide panel and is positioned underneath a respective key of the plurality of keys; and
further comprising a plurality of key switch mechanisms configured to extend through a respective key switch hole and secure the plurality of keys to the base panel.

15. The system of claim 14, wherein the substantially planar light guide panel further comprises a transparent layer comprising a substantially planar upper surface, a substantially planar lower surface, and a perimeter surface.

16. The system of claim 14, wherein each light management feature of the plurality of light management features is proximate to the respective key switch hole.

17. The system of claim 1, wherein the substantially planar light guide panel comprises a substantially planar upper surface, a substantially planar lower surface opposite the upper surface, and a transparent layer disposed between the substantially planar upper surface and the substantially planar lower surface.

18. The system of claim 17, further comprising a reflective layer disposed on at least one of the substantially planar upper surface and the substantially planar lower surface.

19. The system of claim 1, wherein the plurality of curved light management features are at least partially formed from one of printing and coating.

20. The system of claim 19, wherein the printing and the coating comprises a higher index material than a core of the light guide panel.

21. The system of claim 1, wherein a first light management feature of the plurality of light management features comprises a greater number of wells than a second light management feature of the plurality of light management features and less than a third light management feature of the plurality of light management features.

22. The system of claim 21, wherein a depth of the plurality of wells increases as a distance of the plurality of wells increases from the light source.

23. The system of claim 1,
wherein each key switch hole extends therethrough and is positioned underneath a respective key of the plurality of keys;
wherein each of the plurality of curved light emission features is arranged relative to a respective key switch hole such that each of the curved light emission features is adjacent to and substantially surrounds the respective key switch hole, wherein a first curved light emission feature of the plurality of curved light emission features comprises a greater number of wells than a second curved light emission feature of the plurality of curved light emission features and less than a third curved light emission feature of the plurality of curved light emission features; and wherein a first light management feature of the plurality of light management features comprises a greater number of wells than a second light management feature of the plurality of light management features and less than a third light management feature of the plurality of light management features.

24. The system of claim 23, wherein a depth of the plurality of wells increases as a distance of the plurality of wells increases from the light source.

25. The system of claim 1, wherein the plurality of light management features are distal to the light source.

26. The system of claim 1, wherein a depth of a first light management feature of the plurality of light management features is disposed at a first distance from the light source is less than the depth of a second light management feature of the plurality of light management features is disposed at a second distance, greater than the first distance, from the light source.

27. The system of claim 1, wherein a length of a first light management feature of the plurality of light management features is disposed at a first distance from the light source is less than the length of a second light management feature of the plurality of light management features is disposed at a second distance, greater than the first distance, from the light source.

28. The system of claim 1, wherein the plurality of light management features comprise one of an elongated channel, an elongated slot, and a tear-drop shaped opening.

29. The system of claim 1, wherein the light source is disposed at one of a perimeter of the substantially planar light guide panel and a center of the substantially planar light guide panel.

30. The system of claim 1, wherein the substantially planar light guide panel is disposed integrally with the base panel.

* * * * *